United States Patent [19]

Wilson

[11] Patent Number: 4,474,445
[45] Date of Patent: Oct. 2, 1984

[54] VACUUM HOLDDOWN DEVICE FOR FLEXOGRAPHIC PRINTING PLATES

[75] Inventor: Kenneth C. Wilson, Kennett Square, Pa.

[73] Assignee: E. I. Du Pont de Nemours and Company, Wilmington, Del.

[21] Appl. No.: 477,304

[22] Filed: Mar. 21, 1983

[51] Int. Cl.³ .............................................. G03D 5/04
[52] U.S. Cl. .................................... 354/317; 354/325; 354/340; 15/21 R; 15/77; 248/362; 269/21
[58] Field of Search ............... 354/317, 319, 325, 340; 355/73; 15/21 R, 77, 102; 248/362; 269/21

[56] References Cited

U.S. PATENT DOCUMENTS

| | | | |
|---|---|---|---|
| 2,572,640 | 10/1951 | Lovegrove | 248/362 |
| 2,590,044 | 3/1952 | Schaller | 101/250 |
| 2,723,775 | 11/1955 | von Hofe et al. | 216/55 |
| 2,933,014 | 4/1960 | Anander | 355/73 |
| 3,107,078 | 10/1963 | Schutt | 248/363 |
| 3,307,818 | 3/1967 | Cocito | 248/362 |
| 4,068,251 | 1/1978 | Schroter et al. | 354/317 |
| 4,131,267 | 12/1978 | Ono et al. | 269/21 |
| 4,324,487 | 4/1982 | Nishihama | 355/73 |

FOREIGN PATENT DOCUMENTS 1184203 12/1964 Fed. Rep. of Germany ........ 355/73

Primary Examiner—A. A. Mathews

[57] ABSTRACT

A platen for supporting any one of a predetermined number of sizes of flexographic printing plates during wet development includes an interconnected orifice and a suction channel the suction channel surrounding the orifice, and an array of grooves emanating from the channel at spacings in the range from two degrees to fifteen degrees. Each groove is substantially V-shaped in cross-section and has a depth from 0.002 to 0.025 inches. The cross-sectional area of each groove being selected so that when a plate is placed over some portion of the suction channel and the grooves, a developer liquid applied to the plate, and suction applied at the orifice the flow of developer liquid from the plate through each groove is impeded by frictional effects in the grooves thereby forming a seal to permit the suction to hold the plate to the platen even though the plate does not cover the full length of all the grooves.

19 Claims, 5 Drawing Figures

VACUUM HOLDDOWN DEVICE FOR FLEXOGRAPHIC PRINTING PLATES

FIELD OF THE INVENTION

This invention relates to a processor for flexographic printing plates and, in particular, to a platen for supporting any one of a predetermined number of sizes of flexographic printing plates during wet development.

DESCRIPTION OF THE PRIOR ART

In the preparation of a flexible photopolymer printing plate the printing plate is first imagewise exposed through a mask to produce imagewise polymerized and unpolymerized areas.

Following exposure the plate must be subjected to the action of a liquid developer (a solvent) which softens the unpolymerized areas to facilitate their removal. Such removal occurs with the plate clipped to a supporting member and either immersed into or sprayed with liquid developer while a brush scrubs the surface of the plate to remove the unpolymerized areas.

The disadvantage in holding the flexographic printing plate with a clip or similar mechanical device is that the wet flexographic printing plate tends to slip with respect to the supporting member thereby permitting the plate to shift and possibly jam the processing apparatus. In addition, the clip or mechanical fastener covers a portion of the surface of the flexographic printing plate which reduces the area of the plate available for images.

Another approach for holding a flexographic printing plate to a support member which obviates the needs for clips or mechanical fasteners is a vaccum platen. Such a vacuum platen has the disadvantage that it must be sized to hold a specific size plate. Efforts to make a platen that accepts any size flexographic printing plate have resulted in complicated structures, as exemplified by U.S. Pat. No. 3,307,818 (Cocito). In this patent a system of valves is utilized to close all suction holes on the platen not covered by the flexographic printing plate in order to maintain the necessary vacuum to hold the plate in place.

Another approach is shown in U.S. Pat. No. 2,723,775 (von Hofe et al.). In this patent a supporting platen or drum having an intricate system of interconnected concentric and radiating channels is employed for holding thin flexible articles such as labels and transporting the same from a stack of such labels to a receiving surface. Such an intricate pattern as utilized in this device is expensive to machine and for this reason is believed to be economically disadvantageous.

Accordingly, in view of the foregoing it is believed advantageous to provide a support platen for supporting a flexographic printing plate during the development thereof that is easy and inexpensive to machine and which does not utilize clips or other mechanical fasteners.

SUMMARY OF THE INVENTION

The present invention relates to a platen for supporting any one of a predetermined number of sizes of flexographic printing plates during wet development. The platen has an orifice connected to a suction line, an annular suction channel surrounding the orifice and, means in the form of channels for connecting the orifice and the suction channel. The suction channel is preferably concentric to the orifice. The platen further comprises an array of grooves emanating radially from the suction channel at spacings of two degrees to fifteen degrees and preferably from five degrees to ten degrees. Each groove is substantially V-shaped in cross-section and has a depth in the range of 0.002 to 0.025 inches, preferably in the range 0.005 to 0.015 inches. The cross-sectional area of each groove is selected such that when a plate is placed over the suction channel and some portion of the grooves, a developer liquid applied to the plate, and suction applied at the orifice the flow of developer liquid through each groove is sufficiently impeded by frictional effects in the grooves to thereby form a seal to permit the suction to hold the plate to the platen even though the plate does not fully cover all of the grooves.

BRIEF DESCRIPTION OF THE DRAWINGS

The invention will be more fully understood from the following detailed description thereof taken in connection with the accompanying drawings which form a part of the application and in which.

DETAILED DESCRIPTION OF THE INVENTION

Figure 1:
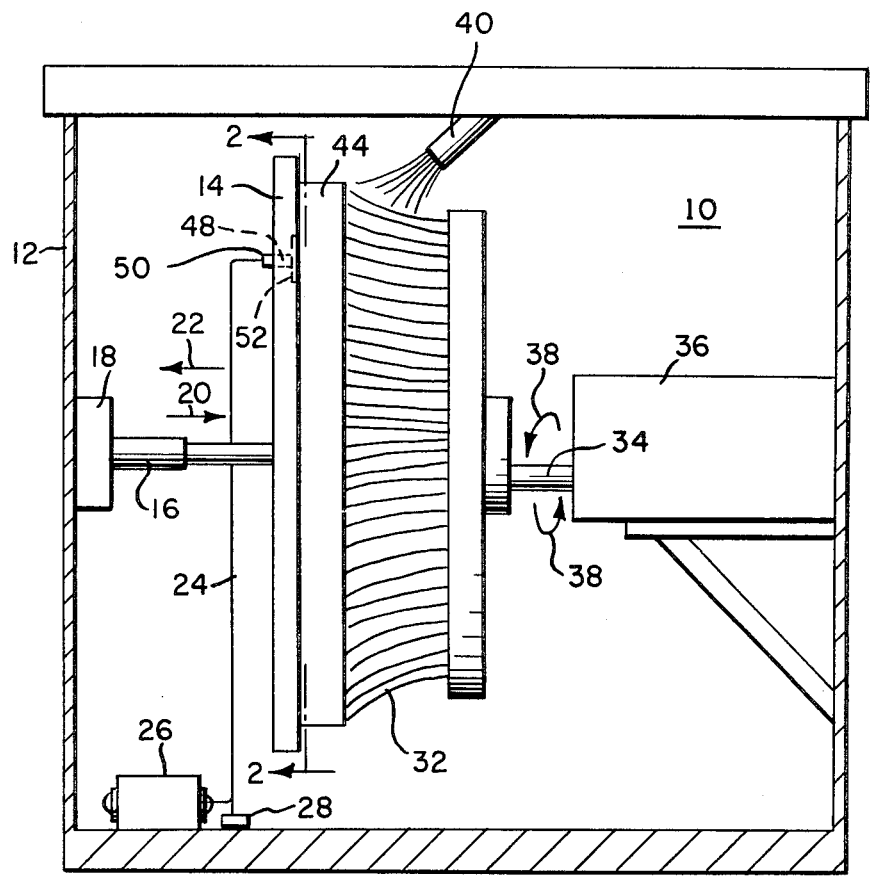
FIG. 1 is a highly stylized pictorial representation of a processor for flexographic printing plates in which a supporting platen in accordance with this invention may be utilized.
Figure 2:
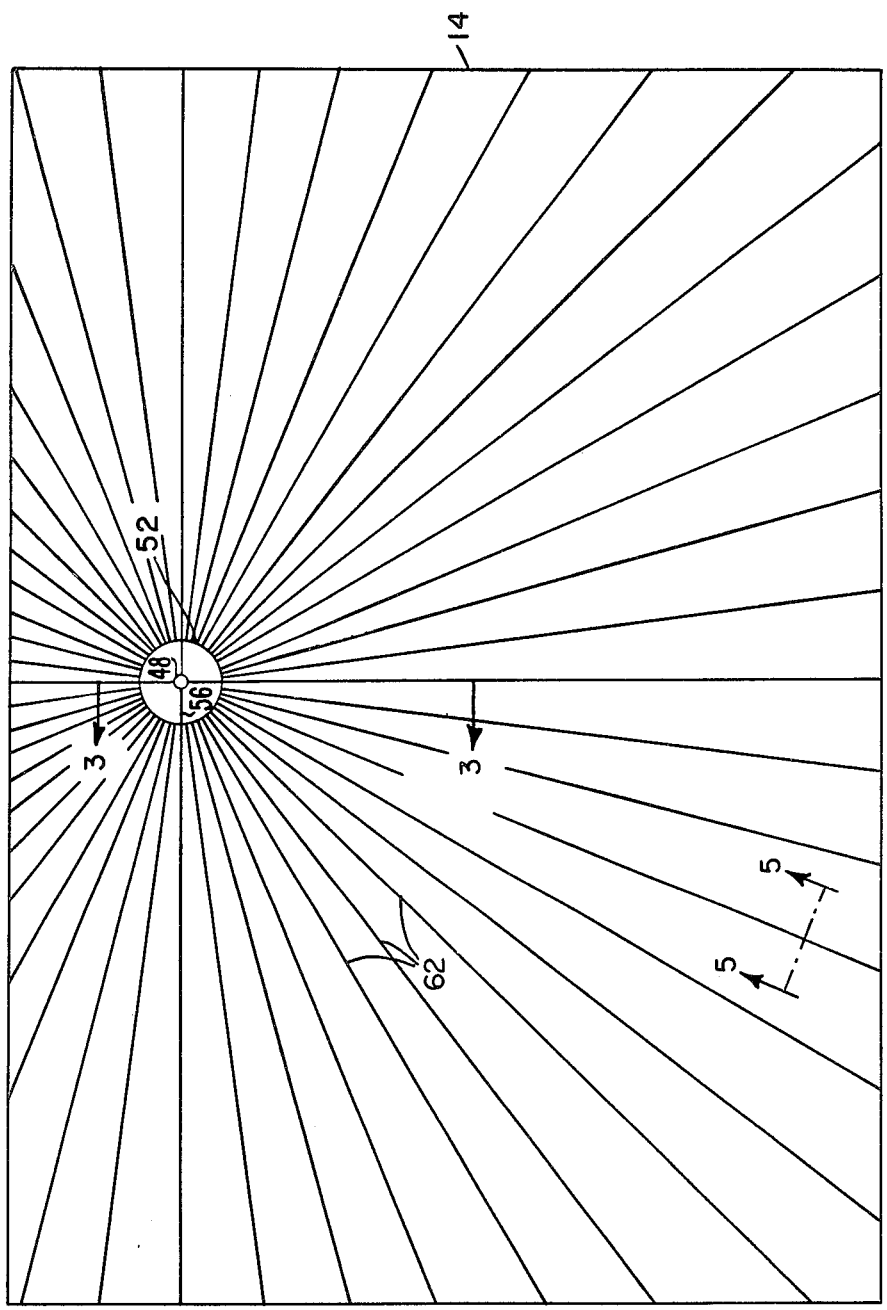
FIG. 2 is a view of the support platen in accordance with the present invention taken along view lines 2—2 on FIG. 1.
Figure 3:
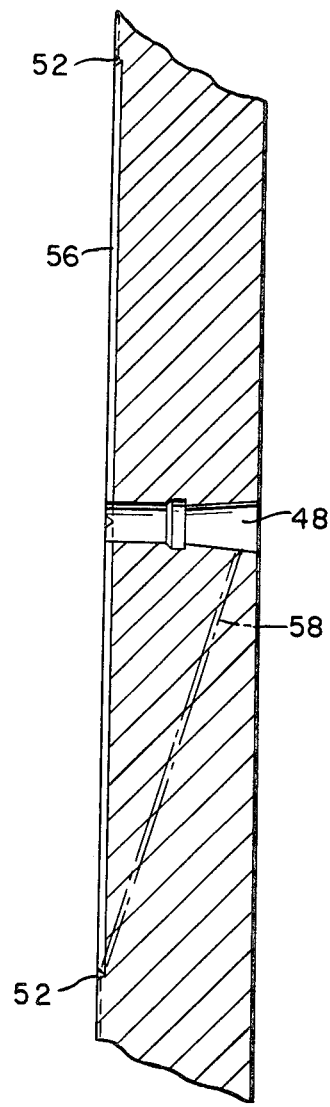
FIG. 3 is a sectional view taken along section lines 3—3 in FIG. 2.

Throughout the following detailed description similar reference numerals refer to similar elements in all figures of the drawings.

With reference to FIG. 1 a processor generally indicated by reference character 10 for processing flexographic printing plates is shown. The processor 10 includes a framework 12 on which a platen 14 in accordance with the present invention is mounted. The platen 14 is supported on a reciprocable shaft 16 connected to any suitable reciprocating actuator 18 whereby the platen 14 may be moved in opposed directions, as indicated by reference arrows 20 and 22. The platen 14 may be connected in a manner to be described through a suction line 24 to a vacuum source 26 such as a vacuum pump. Depending upon the type of vacuum source utilized a liquid trap 28 may be employed.

A scrubbing brush 32 is supported within the frame 12 opposite to the platen 14 in a substantially parallel relationship thereto. The brush 32 is connected by a shaft 34 to a drive mechanism 36. The drive mechanism 36 is arranged to impart an orbital motion in the direction of arrow 38 to the brush 32. Also disposed within the frame 12 adjacent the upper portion thereof is a spray nozzle 40 adapted to spray developer liquid, such as a solvent, toward or onto the surface of a flexographic printing plate 44 supported on the platen 14. In instances where developer liquid is sprayed onto the printing plate it is advantageous that the same pump be used both to circulate the developer liquid and to produce the necessary suction to hold the printing plate 44 on the platen 14. This may be accomplished using a dual suction line, one end of which leads to the platen and the second end of which leads to a source of developer liquid.

Figure 4:
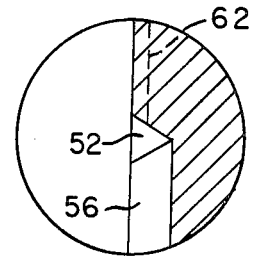
FIG. 4 is an enlarged detailed view of that portion of FIG. 3 indicated by the circle.

With reference to FIGS. 2 through 5 the structural details of the platen 14 in accordance with the present invention are shown. The platen 14 is a substantially planar member fabricated from any suitable structurally rigid material such as aluminum, stainless steel, or a synthetic material having comparable structural rigidity. The surface of the platen 14 may be coated with an epoxy or other suitable coating if desired. Adjacent the upper central portion of the plate 14 is a suction orifice 48. The suction orifice is connectable to the suction line 24 through a suitable fitting 50. An annular suction channel 52 is formed in the surface of the platen 14 and arranged to surround the suction orifice 48. Preferably, but not necessarily, the suction channel 52 is arranged concentrically with the orifice 48. As seen in FIG. 4 the suction channel 52 exhibits a generally V-shaped cross-section. The included angle of the V-shape of the suction channel 52 is preferably 60°. The depth of the suction channel and the included angle of the V must be chosen such that when a flexographic printing plate 44 is placed thereover and suction is applied the plate 44 will not noticeably deflect and enter into the suction channel. In practice, this depth is 0.060 inches. The cross-sectional area of the suction channel 52 must be equal to or greater than the sum of the cross-sectional areas of the grooves 62 (discussed herein).

Means generally indicated by reference character 56 in the form of radially extending furrows are provided to interconnect the suction orifice 48 and the suction channel 52. The furrows 56 may exhibit any convenient cross-section. However, the same constraints on the cross-section as discussed in connection with channel 52 apply to the furrows 56. The means 56 may also take the form of passages 58 formed within the body of the platen 14 and connecting the suction channel 52 to the orifice 48 at some predetermined point 60 below the surface of the platen 14.

Figure 5:
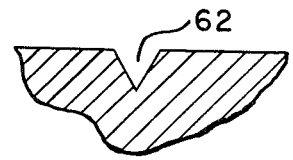
FIG. 5 is a sectional view taken along section lines 5—5 in FIG. 2.

An array of grooves 62 emanate from the suction channel 52 and extend to the peripheral boundaries of the platen 14. The grooves are spaced in a radial pattern centered on the suction orifice 48 with the angular spacing between adjacent ones of the grooves 62 lying in the range of two degrees to fifteen degrees and preferably in the range from five degrees to ten degrees. For a platen 14 arranged to hold flexographic plates of up to thirty by forty inches a radiating pattern of grooves 62 with seven degree spacing is preferred. Each of the grooves 62 is substantially V-shaped in cross-section and has a depth in the range of 0.002 to 0.025 inches. Preferably the depth of each of the grooves 62 is in the range from 0.005 to 0.015 inches (FIG. 5). The cross-sectional area of the suction orifice 48 is equal to or greater than the sum of the cross-sectional areas of each of the grooves 62. In the case of a platen 14 holding a thirty by forty inch plate, an orifice diameter of 0.125 inches is preferred.

In operation an exposed photopolymer flexographic printing plate 44 is temporarily supported over platen 14 by any suitable temporary means of attachment. The plate 44 must be placed with respect to the platen 14 such that the undersurface of the plate 44 covers the entire suction channel 52 and some portion of each of the grooves 62. The actuator 18 moves the platen 14 inwardly in the direction of the arrow 20 toward the brush 32 thereby bringing the surface of the plate 44 into contact with the brush 32. Substantially simultaneously developer liquid is sprayed from the nozzle 40 onto the plate 44 and the vacuum source 26 also actuated to apply a suction through the line 24 to the orifice 48. As air is drawn from the undersurface of the plate 44 liquid developer is also drawn under the plate 44 wetting the undersurface. The cross-sectional area of each groove 62 is selected such that when a flexographic printing plate 44 is placed in the manner above discussed, developer liquid is sprayed over the plate and platen, and the suction is applied at the orifice the flow of developer liquid from the plate 44 through each groove 62 is impeded by frictional effects in the grooves 62 thereby forming a seal to permit the suction to hold the flexographic printing plate to the platen even though the flexographic printing plate does not cover the full length of all of the grooves. Thus, any size flexographic printing plate may be held on the platen 14 from the undersurface of the plate without the need for clips or other mechanical fasteners.

With the flexographic printing plates securely supported on the platen through the action of the suction the platen 14 is further advanced in the direction 20 bringing the surface of the plate 44 into intimate contact with the bristles of the brush 32. The drive mechanism 36 for the brush 32 is then actuated imparting an orbital motion in the direction of arrow 38 thereby scrubbing away the softened portions of the unpolymerized areas of the plate 44 under the continued action of the liquid developer emanating from the nozzle 40.

After a predetermined development time the actuator 18 retracts the platen 14 in the direction of the arrow 22. The vacuum source 26 is turned off thus releasing the developed plate 44. Residual vacuum between the undersurface of the plate 44 and the platen 14 tends to temporarily keep the plate 44 in place until it is removed by an operator.

It may be appreciated in view of the foregoing that there has been provided in accordance with the present invention a platen which is able to support any one of a predetermined number of sizes of flexographic printing plates during the wet development thereof. Those skilled in the art having the benefit of the teachings as hereinabove set forth may effect numerous modifications thereto. These modifications are to be construed as lying within the scope of the present invention as defined in the appended claims.

What is claimed is:

1. A platen for supporting any one of a predetermined number of sizes of flexographic plates during wet development, the platen having:

an orifice;

an annular suction channel surrounding the orifice means for connecting the orifice and the suction channel; and an array of grooves emanating from the channel at angular spacings in the range from two degrees to fifteen degrees, each groove being substantially V-shaped in cross-section and having a depth in the range from 0.002 to 0.025 inches, the cross-sectional area of each groove being selected such that when a printing plate is placed over the suction channel and some portion of the grooves, a developer liquid applied to the plate, and suction applied at the orifice the flow of developer liquid from the wet plate through each groove is impeded by the frictional effects in the grooves thereby forming a seal to permit the suction to hold the plate to the platen even though the plate does not cover the full length of all of the grooves.

2. The platen of claim 1 wherein the angular spacings of the grooves lie within the range from five degrees to ten degrees.

3. The platen of claim 2 wherein the angular spacings of the grooves is seven degrees.

4. The platen of claim 1 wherein the depth of the grooves lies within the range from 0.005 to 0.015 inches.

5. The platen of claim 2 wherein the depth of each of the grooves lies within the range from 0.005 to 0.015 inches.

6. The platen of claim 1 wherein the cross-sectional area of the suction channel equal to or greater than the sum of the cross-sectional areas of each of the grooves.

7. The platen of claim 2 wherein the cross-sectional area of the suction channel is equal to or greater than the sum of the cross-sectional areas of each of the grooves.

8. The platen of claim 4 wherein the cross-sectional area of the suction channel is equal to or greater than the sum of the cross-sectional areas of each of the grooves.

9. The platen of claim 5 wherein the cross-sectional area of the suction channel is equal to or greater than the sum of the cross-sectional areas of each of the grooves.

10. The platen of claim 1 wherein the grooves emanate from the suction channel and extend to the peripheral borders of the platen.

11. The platen of claim 1 wherein the orifice is located at the upper mid-portion of the platen.

12. The platen of claim 1 wherein the means for connecting the orifice and the suction channel comprises an array of furrows disposed on the surface of the platen.

13. The platen of claim 1 wherein the means for connecting the orifice and the suction channel comprises an array of passages disposed through the material of the platen.

14. In a flexographic printing plate processing apparatus of the type having a support for flexographic printing plate, a brush for scrubbing the surface of a flexographic printing plate held on the support, means to advance the flexographic printing plate into contact with the brush, and means to apply a developer liquid to the surface of the flexographic printing plate, wherein the improvement comprises a platen for supporting any one of a predetermined number of sizes of flexographic printing plates during wet development, the platen having;
   an orifice:
   an annular suction channel surrounding the orifice;
   means for connecting the orifice and the suction channel; and
   an array of grooves emanating from the channel at angular spacings in the range from two degrees to fifteen degrees, each groove being substantially V-shaped in cross-section and having a depth in the range from 0.002 to 0.025 inches, the cross-sectional area of each groove being selected such that when a printing plate is placed over the suction channel and some portion of the grooves, a developer liquid applied to the plate, and suction applied at the orifice the flow of developer liquid from the wet plate through each groove is impeded by frictional effects in the grooves thereby forming a seal to permit the suction to hold the plate to the platen even though the plate does not cover the full length of all of the grooves.

15. The printing plate processing apparatus of claim 14 wherein the depth of the grooves lies in the range from 0.005 to 0.015 inches.

16. The printing plate processing apparatus of claim 15 wherein the angular spacings of the grooves lie in the range from five degrees to ten degrees.

17. The printing plate processing apparatus of claim 14 wherein the cross-sectional area of the suction channel is equal to or greater than the sum of the cross-sectional areas of each of the grooves.

18. The printing plate processing apparatus of claim 16 wherein the cross-sectional area of the suction channel is equal to or greater than the sum of the cross-sectional areas of each of the grooves.

19. The printing plate processing apparatus of claim 17 wherein the cross-sectional area of the suction channel is equal to or greater than the sum of the cross-sectional areas of each of the grooves.

* * * * *